(12) United States Patent
Vityaev

(10) Patent No.: US 7,490,284 B2
(45) Date of Patent: Feb. 10, 2009

(54) META-VITERBI ALGORITHM FOR USE IN COMMUNICATION SYSTEMS

(75) Inventor: Andrei E. Vityaev, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 425 days.

(21) Appl. No.: 11/049,769

(22) Filed: Feb. 3, 2005

(65) Prior Publication Data

US 2006/0174180 A1 Aug. 3, 2006

(51) Int. Cl.
*H03M 13/03* (2006.01)
*H03M 13/00* (2006.01)

(52) U.S. Cl. ...................................... 714/795; 714/755
(58) Field of Classification Search ................. 714/755, 714/795
See application file for complete search history.

(56) References Cited

U.S. PATENT DOCUMENTS

| | | | | |
|---|---|---|---|---|
| 5,081,651 A | * | 1/1992 | Kubo | 375/341 |
| 5,291,499 A | * | 3/1994 | Behrens et al. | 714/796 |
| 5,430,739 A | * | 7/1995 | Wei et al. | 714/784 |
| 5,457,704 A | * | 10/1995 | Hoeher et al. | 714/794 |
| 6,307,901 B1 | * | 10/2001 | Yu et al. | 375/341 |
| 6,427,220 B1 | | 7/2002 | Vityaev | |
| 6,765,507 B2 | * | 7/2004 | Yokokawa et al. | 341/50 |

OTHER PUBLICATIONS

Roy D. Cideciyan, Jonathan D. Coker, Evangelos Eleftheriou, and Richard L. Galbraith, Noise Predictive Maximum Likelihood Detection Combined with Parity-Based Post-Processing, IEEE Transactions on Magnetics, vol. 37, No. 2, Mar. 2001, pp. 714-720, The Institute of Electrical & Electronics Engineers, USA.

Z.A. Keirn, Victor Y. Krachkovsky, Erich F. Haratsch, and Harley Burger, Use of Redundant Bits for Magnetic Recording: Single-Parity Codes and Reed-Solomon Error-Correcting Code, IEEE Transactions on Magnetics, vol. 40, No. 1, Jan. 2004, pp. 225-230, The Institute of Electrical & Electronics Engineers, USA.

Jeff L. Sonntag and Bane Vasic, Implementation and Bench Characterization of a Read Channel with Parity Check Postprocessor. Digests of The Magnetic Recording Conference 2000 (TMRC 2000), Santa Clara, CA, 2000, 2 pages, The Institute of Electrical & Electronics Engineers, USA.

(Continued)

*Primary Examiner*—Joseph D Torres
(74) *Attorney, Agent, or Firm*—McAndrews, Held & Malloy, Ltd.

(57) ABSTRACT

Herein described is a system and a method of detecting and correcting data bit errors using a sequence of one or more codewords transmitted through a communication channel characterized by intersymbol interference. Each of the one or more codewords incorporates one or encodes one or more parity bits. The codewords are processed by a Meta-Viterbi detector that utilizes a Meta-Viterbi algorithm. The Meta-Viterbi detector comprises an event weight processor, a computational circuitry, a parity syndrome calculator, and an error correction circuitry. The Meta-Viterbi detector receives an output generated from a Viterbi detector having $2^s$ states and processes the received output using a trellis diagram having $2^r$ states.

11 Claims, 8 Drawing Sheets

OTHER PUBLICATIONS

Weishi Feng, Andrei Vityaev, Greg Burd & Nersi Nazari, On the Performance of Parity Codes in Magnetic Recording Systems, 2000, pp. 1877-1881, The Institute of Electrical & Electronics Engineers, USA.

Aleksandar Kavčić and José M. F. Moura, Maximum Likelihood Sequence Estimation in Channels with Intersymbol Interference and Noise Memory, Aug. 1998, 1 page, ISIT 1998, Cambridge, MA, USA.

Ajay Dholakia, Evangelos Eleftheriou, & Thomas Mittelholzer, Capacity-Approaching Codes: Can They Be Applied to the Magnetic Recording Channel?, Feb. 2004, pp. 122-130, IEEE Commmunication Magazine, The Institute of Electrical & Electronics Engineers, USA.

Andrei Vityaev and Alan Armstrong, Measurement and Modeling of System-Level Read-Channel Performance, Dec. 2000, pp. 30-33, Data Storage Magazine, USA.

Forney G D, "The Viterbi Algorithm", Proceedings of the IEEE, IEEE, New York, NY, USA, vol. 61 No. 3, Mar. 1, 1973, pp. 268-278, XP000573242 ISSN: 0018-9219.

Eleftheriou E et al, "Improving Performance of PRML/EPRML Through Noise Prediction", EEE Transactions on Magnetics, Sep. 1996, XP002370660.

\* cited by examiner

Set of Error Events: $\{e_3, e_7, e_{10}, e_{15}\}$

| Sequence | No $e_1$ | No $e_2$ | $e_3$ | No $e_4$ | No $e_5$ | No $e_6$ | $e_7$ | No $e_8$ | No $e_9$ | $e_{10}$ | No $e_{11}$ | No $e_{12}$ | No $e_{13}$ | No $e_{14}$ | $e_{15}$ |
|---|---|---|---|---|---|---|---|---|---|---|---|---|---|---|---|
| Event Parity | -- | -- | 0011 | -- | -- | -- | 0111 | -- | -- | 1010 | -- | -- | -- | -- | 1111 |
| Event Weight | -- | -- | $w(e_3)$ | -- | -- | -- | $w(e_7)$ | -- | -- | $w(e_{10})$ | -- | -- | -- | -- | $w(e_{15})$ |
| Cumulative Parity (state) | 0000 | 0000 | 0011 | 0011 | 0011 | 0011 | 0100 | 0100 | 0100 | 1110 | 1110 | 1110 | 1110 | 1110 | 0001 |
| Cumulative Weight (path metric) | 0 | 0 | $w(e_3)$ | $w(e_3)$ | $w(e_3)$ | $w(e_3)$ | $w(e_3)$ + $w(e_7)$ | $w(e_3)$ + $w(e_7)$ | $w(e_3)$ + $w(e_7)$ | $w(e_3)$ + $w(e_7)$ + $w(e_{10})$ | $w(e_3)$ + $w(e_7)$ + $w(e_{10})$ | $w(e_3)$ + $w(e_7)$ + $w(e_{10})$ | $w(e_3)$ + $w(e_7)$ + $w(e_{10})$ | $w(e_3)$ + $w(e_7)$ + $w(e_{10})$ | $w(e_3)$ + $w(e_7)$ + $w(e_{10})$ + $w(e_{15})$ |

Figure 3A

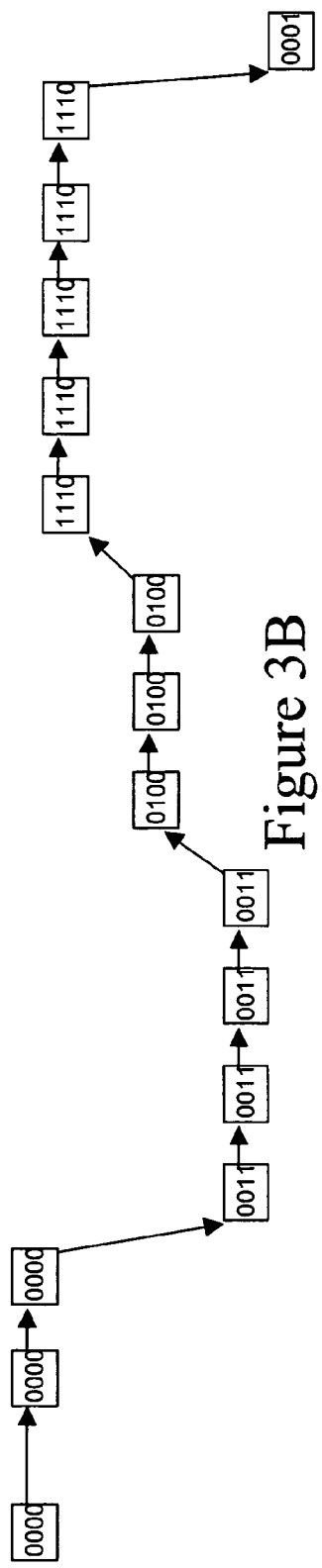

Path Through 16-State Meta-Trellis:

Figure 3B

META-VITERBI ALGORITHM FOR USE IN COMMUNICATION SYSTEMS

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

It is well known that the Viterbi algorithm may be used for the maximum likelihood detection of data. In the absence of parity encoding, the partial response maximum likelihood/noise predictive maximum likelihood (PRML/NPML) detection of data can be accomplished by using a Viterbi detector with $2^s$ states. When using t bits of parity with the Viterbi algorithm, maximum likelihood decoding for a partial response system would require a Viterbi detector with $2^{s+t}$ states. Unfortunately, the post-processor schemes that are available perform sub-optimal detection for partial response systems with parity. These schemes may combine the Viterbi detector and a post-processor. The Viterbi detector utilizes $2^s$ states for de-convolving the data out of the partial response signaling without taking parity bits into account while a post-processor may utilize t parity bits to locate the error events in the Viterbi output. For single bit parity codes, conventional post-processing schemes perform well, but for multiple bit parity schemes, such as when using a t bit parity scheme, the performance in bit error rate and, especially, in error correction code failure rate suffers significantly from that of a $2^{s+t}$ state Viterbi detector.

The limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Various aspects of the invention provide a system and a method of detecting and correcting one or more data bit errors transmitted through a communication channel characterized by intersymbol interference. In a representative embodiment, the communication channel comprises a read/write channel or a magnetic hard disk drive.

In a representative embodiment, a method of detecting and correcting data bit errors in one or more received codewords transmitted through a communication channel comprises first processing the one or more received codewords using a Viterbi detector having $2^s$ states, generating an output from the Viterbi detector, and second processing the output using a Meta-Viterbi detector having $2^t$ states, wherein the communication channel exhibits intersymbol interference.

In yet another representative embodiment, a method of correcting one or more data bit errors in a kth received codeword of a communications channel comprises determining one or more error events of the kth received codeword, wherein the one or more error events is used to correct the one or more data bit errors. The method further comprises using a linear operator that computes one or more parity syndromes of the one or more error events. The method further comprises determining one or more preferred error events associated with the one or more parity syndromes. Furthermore, the method comprises using the one or more preferred error events to construct a trellis diagram. Additionally, the method further comprises selecting a path of the trellis diagram associated with a minimum cumulative event weight, wherein the communications channel exhibits intersymbol interference.

In a representative embodiment, a system for detecting and correcting data bit errors in one or more received codewords transmitted through a communication channel comprises a Viterbi detector that processes the one or more received codewords and a Meta-Viterbi detector that processes the one or more received codewords processed by the Viterbi detector, wherein the Meta-Viterbi detector is used for computing event parity syndromes, associated event weights, and cumulative event weights. The Meta-Viterbi detector is also used for performing add, compare, and select operations.

These and other advantages, aspects, and novel features of the present invention, as well as details of illustrated embodiments, thereof, will be more fully understood from the following description and drawings.

BRIEF DESCRIPTION OF THE DRAWINGS

FIG. 3A is a table illustrating the computation of cumulative parity and cumulative weight of a subset of error events (subset of $H_k$) associated with a four-bit parity codeword, in accordance with an embodiment of the invention.

FIG. 3B is a diagram illustrating the 16 state Meta-Viterbi trellis path taken when the error events correspond to $\{e_3, e_7, e_{10}, e_{15}\}$, as described in relation to FIG. 3A, in accordance with an embodiment of the invention.

DETAILED DESCRIPTION OF THE INVENTION

Various aspects of the invention provide a system and method of detecting and correcting data bit errors that occur when a data stream is transmitted through a communication channel. The data bit errors may be detected and corrected by way of transmitting a sequence of codewords. The codewords may incorporate or encode one or more parity bits into the transmitted data. The codewords are used in the detection and correction process to recover the data transmitted. The method as described herein utilizes what is referred to as a Meta-Viterbi Algorithm. The system that performs the detection and correction as described herein may be termed a Meta-Viterbi detector.

In a representative embodiment, the channel may comprise a read/write channel of a magnetic hard disk drive. In another representative embodiment, the channel may comprise any communications transmission channel. The various aspects of the invention provide a system and method of detecting and correcting data bit errors in the presence of intersymbol interference (ISI). Aspects of the invention provide an optimum solution that is bounded by that provided by using the Viterbi Algorithm. However, various aspects of the invention provide a significant reduction in implementation complexity compared with that provided by only using the Viterbi Algorithm to detect codewords. The various aspects of the invention implement at least a method and a system of determining an optimum set of one or more error events associated with a parity syndrome of a transmitted codeword. Each transmitted codeword is associated with an optimal set of one or more error events. The set of error events may be used to correct the codeword by way of using its parity syndrome. The optimal set of one or more error events is associated with a minimum cumulative event weight computed by a path formed from the decision branches of a trellis diagram. The path traverses one or more steps corresponding to the number of error events associated with the codeword. The set or error events may be determined by using the parity syndrome and cumulative parity of the codeword. A path or route is taken over a decision tree or trellis diagram by way of one or more decision branches. The branch taken corresponds to whether a particular error event occurs in a codeword. Each of the one or more paths is associated with an event weight. The cumulative weight may be found by summing the event weights of the branches used to create the path of a codeword. The path with the smallest cumulative weight is chosen as the optimal solution for correcting the codeword. Consequently, the set of error events associated with this path is used to correct the codeword. The cumulative parity at the last step of the path may coincide with the parity syndrome of the received codeword.

Figure 1:
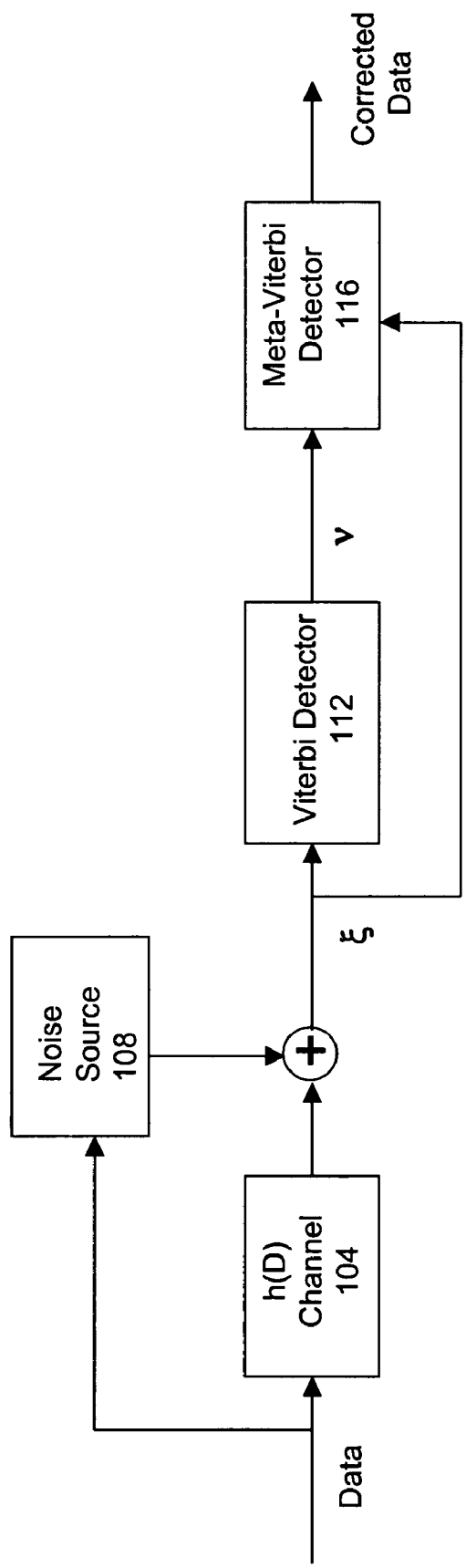
FIG. 1 is a functional block diagram of a system that utilizes the Meta-Viterbi Algorithm in accordance with an embodiment of the invention.

FIG. 1 is a functional block diagram of a system that utilizes the Meta-Viterbi Algorithm in accordance with an embodiment of the invention. The system comprises a partial response system with equalized channel response. The noise may be data-dependent. In a representative embodiment, the noise may be characterized as additive white Gaussian noise (AWGN). In a representative embodiment, the system may comprise a magnetic disk drive system that corrects one or more data bit errors of one or more codewords by way of utilizing the Meta-Viterbi Algorithm. Of course, the system may comprise any type of communications system. As illustrated, the system comprises a channel 104, a noise source 108, a Viterbi detector 112, and a Meta-Viterbi detector 116. In a representative embodiment, the channel 104 models an equalized channel response, represented by the function h(D), while the noise source 108 models a data-dependent correlated additive Gaussian noise source. Initial detection of data (i.e., received codewords) is accomplished by the Viterbi detector 112 using $2^s$ states. Certain aspects of the invention provide that s=deg h(D), or that the degree of the polynomial, h(D) equals the variable s, when AWGN is introduced into the channel. In other cases, it is possible to have s>deg h(D). Aspects of the invention provide that the system shown in FIG. 1 processes codewords in a more efficient manner by way of adding t bits of redundancy to each codeword, and allowing the Meta-Viterbi detector 116 to process the codewords using $2^t$ states. Linear block coding may be used at the transmitter, for example, to generate codewords having t bits of parity. In comparison to other post-processing schemes, the Meta-Viterbi detector 116 of FIG. 1 may utilize any number of error events per codeword and any combination of error events that cross the boundary between two codewords. This allows the use of long-blocklength codes, such as 390/396 six-bit parity code, where multiple error events frequently occur in the same codeword. This processing method avoids the code rate penalty present in conventional post-processing schemes. It also improves the after-ECC performance compared to post-processing schemes that restrict the number of error events per codeword.

In a representative embodiment, a linear code is used to encode the data prior to transmitting the data across the channel. As such, the Meta-Viterbi Algorithm employed by the Meta-Viterbi detector 116 applies to any data that is linear encoded.

When the Viterbi Algorithm approach is solely used in a maximum likelihood (PRML/NPML) detection process, the number of states required in the detection process comprises $2^{s+t}$ states. Other methods used to perform sub-optimal detection may combine a Viterbi detector 112 using a post-processor. However, such methods using multiple parity bits suffer in performance because of increases in BER, for example.

As shown in FIG. 1, write data containing $\chi$ bits has been written on the magnetic disk drive media. The sequence $\xi$ of noisy received samples is sent to $2^s$ state PRML Viterbi detector 112. The $2^s$ state Viterbi detector 112 finds the sequence of data bits that maximizes the logarithm of the following likelihood function:

$$v = \underset{x \in \{0,1\}^\chi}{\arg\max} \log P(\xi|x)$$

The $2^s$ state Viterbi detector 112 finds the best sequence in all of $\{0,1\}^\chi$ without taking parity into account.

Various aspects of the present invention uses a predetermined "golden set" of atomic error events, $G=\{g_1, g_2, \ldots, g_n\}$, that is most likely to occur at the output of the $2^s$ state Viterbi detector 112. In the exemplary case when the algorithm is applied to magnetic recording (i.e., for a magnetic hard disk drive) and when the codewords employ a one-bit parity code, the set G is given by $G=\{[+1],[-1],[+1,-1,+1],[-1,+1,-1]\}$. One may define an error event to be a sequence $e \in \{-1,0,+1\}^\chi$ such that $v+e \in \{0,1\}^\chi$ where "+" denotes conventional arithmetic addition. The atomic error events represented by G have length comprising a few bits while general error events comprise a length is equal to that of the Viterbi detector 112 output. When an error event is added to v, the resulting value comprises binary values—"0" or "1". Hence an error event comprises an operand such that when it is added to v, its sum comprises values that are either "0's" or "1's". The set of all operands may be found by determining a set of error events that comprise codewords that shift the one or more atomic events of G within a codeword. The set of all such shifts may be described by the following equation:

$$G^*(v) = \{e \in \{0,1\}^\chi | v+e \in \{0,1\}^\chi, e(D) = D^i g(D) \text{ for some } i \text{ and some } g \in G\}$$

For example, if v=[1,0,1,0,1,0,1,0, . . . ] and G={[+1],[−1],[+1,−1,+1],[−1,+1,−1]}, then G*(v) contains the following error events:

[−1,0,0,0,0,0, . . . 0], [−1,+1,−1,0,0,0,0, . . . 0]

[0,+1,0,0,0,0, . . . 0], [0,+1,−1,+1,0,0,0,0, . . . 0], and so on.

If we assume that v comprises m parity codewords, the Meta-Viterbi detector 116, by way of using the linear operator, may compute the parity syndrome values $\Phi[k]:\{0,1\}^\chi \to \{0,1\}^t$. The length of the Viterbi detector 112 output is given by $\chi$ while the number of parity bits is given by t. The parities of the first codeword, $\pi_1 = \Phi[1](v)$, second codeword, $\pi_2 = \Phi[2](v)$, etc., may be computed. The sequence of syndrome values may be represented by $\pi_1, \pi_2, \ldots, \pi_m \in \{0,1\}^t$.

The optimal set of error events may be determined by the Meta-Viterbi detector 116 by way of calculating the appropriate event weights, computing the parity syndrome of the received codeword, and computing the cumulative parity while considering any error events that cross the boundary between two codewords. The Meta-Viterbi detector 116 may compute the event weight of an error event by using the following equation:

w(e)=log P($\xi$|v)−log P($\xi$|v+e), where log P($\xi$|x) is the logarithm of the likelihood of the bit sequence $\xi$. The function w is always positive because log P($\xi$|v+e)<log P($\xi$|v)∀e∈G*(v). However, for the purposes of explaining the Meta-Viterbi Algorithm, it is sufficient to assume that there is a function given by the following equation:

w:G*(v)→(0, ∞), wherein each error event maps to an associated event weight.

The Meta-Viterbi detector 116 determines the set of error events for the output provided by the Viterbi detector 112 by solving the following optimization problem:

Given Viterbi detector 112 output v, the Meta-Viterbi detector 116 computes a set of error events E={$e_1, e_2, \ldots, e_n$}, E⊂G*(v) such that the set of error events corrects the parity syndrome of each codeword in v by way of the following equation, $$\Phi[k](E) := \Phi[k](e_1) \oplus \Phi[K](e_2) \oplus \ldots \oplus \Phi[k](e_n) = \pi_k,$$
$$\forall k,$$

and has the smallest weight w(E), wherein w(E) is given by the following equation:

$$w(E) := \sum_{e \in E} w(e).$$

In most instances, the Meta-Viterbi detector 116 generates an output that corresponds to the output of a Viterbi detector using $2^{s+t}$ states. The output of the Meta-Viterbi detector 116 may be represented by the following equation:

$$v^{(0)} = v + \sum_{e \in E} e$$

Figure 2:
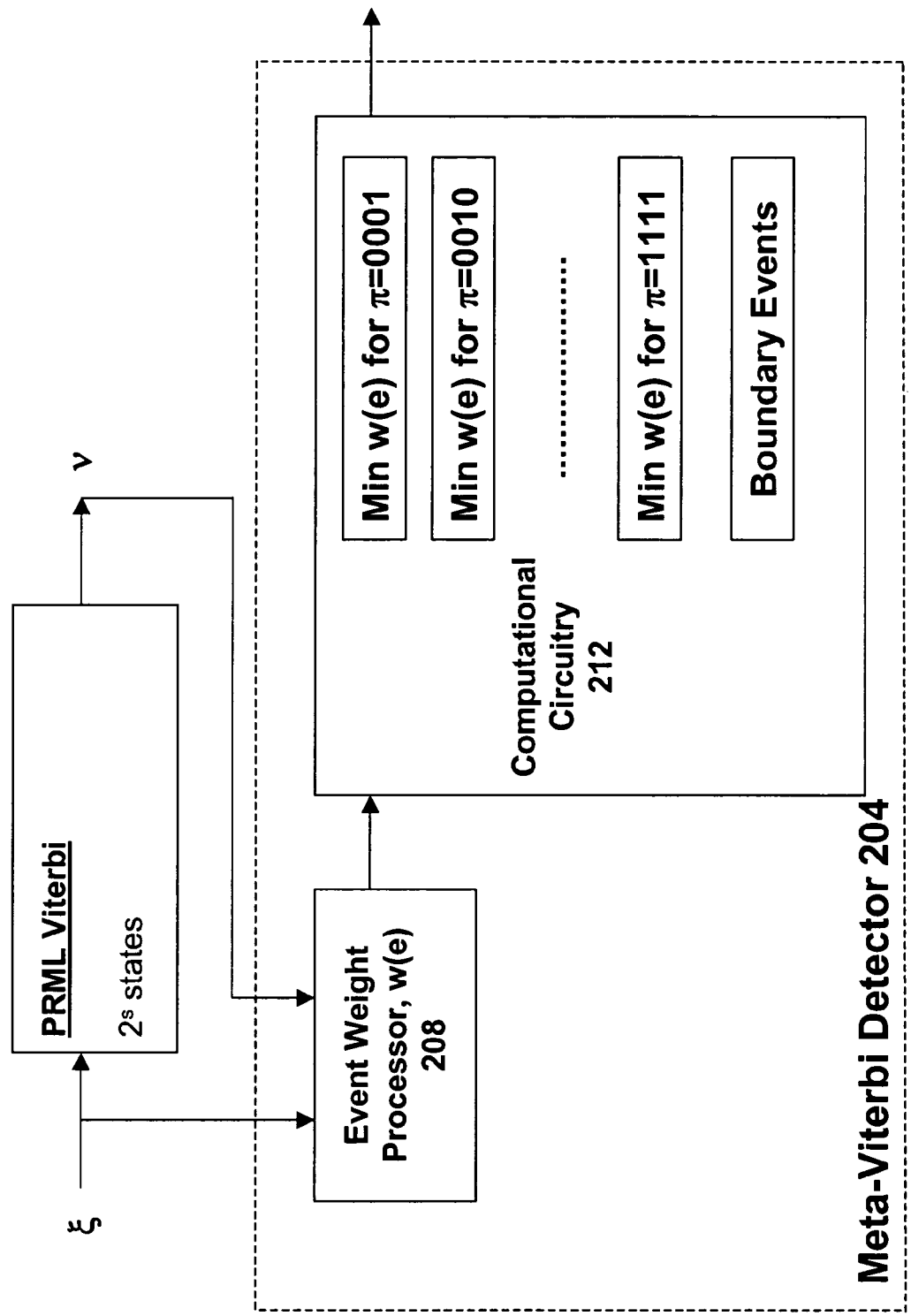
FIG. 2 is a functional block diagram describing the components of a Meta-Viterbi detector that are used in determining a preferred set of error events, in accordance with an embodiment of the invention.

FIG. 2 is a functional block diagram describing the components of a Meta-Viterbi detector 204 (e.g., 116 of FIG. 1) that are used in determining a preferred set of error events, in accordance with an embodiment of the invention. The Meta-Viterbi detector 204 comprises an event weight processor 208 and a computational circuitry 212. The event weight processor 208 computes the event weight, w(e) for each event e∈E and the computational circuitry 212 determines the error events e1, e2, e3, . . . etc., such that:

$$\Phi[k](e) = \pi \neq 0, \Phi[j](e) = 0 \forall j \neq k$$

and $$e = \operatorname*{argmin}_{x \in \Omega} w(x),$$

where $$\Omega = \{x \in G*(v), \Phi[k](x) = \pi, \Phi[j](x) = 0 \forall j \neq k\}$$

The event weight processor 208 processes a sequence of noisy received codewords, $\xi$, along with the output codewords provided by the PRML Viterbi detector. The PRML Viterbi detector decodes $2^s$ states.

The computational circuitry 212 determines the preferred error events that have the smallest event weight for each possible parity syndrome, given t parity bits or $2^t$ states. Further, the computational circuitry 212 records any and all error events that may be applied across boundaries between codewords. In FIG. 2, the computational circuitry 212 may also record the parity syndrome values associated with one or more codewords. The representative embodiment of FIG. 2 illustrates how the Meta-Viterbi detector 204 determines a preferred set of error events when a four-bit parity code is used for each codeword. In this representative embodiment, there is a preferred error event associated with each of the 15 possible syndromes within a codeword. The preferred error events are considered "locally minimized", since their associated event weight is a minimum value for the associated parity syndrome. Each of the preferred error events comprises an error event step in the Meta-Viterbi trellis diagram. Overall, the various aspects of the present invention may be applied to codewords comprising one or more parity bits. FIG. 2 provides a representative embodiment illustrating the use of a Meta-Viterbi algorithm using codewords having an exemplary four bits of parity.

The preferred set of error events for the kth codeword may be denoted by the following equation:

$$H_k = \left\{ e_\pi \text{ for } \forall \ \pi \in \{0, 1\}^t, \pi \neq 0 \middle| e_\pi = \operatorname*{argmin}_{x \in \Omega} w(x), \right.$$

$$\Omega = \{x \in G*(v), \Phi[k](x) = \pi, \Phi[j](x) = 0 \forall j \neq k\} \Big\}.$$

Similarly, the variable $H_{k,k+1}$ may be used to denote the preferred set of error events that cross the boundary of the kth to the (k+1)st codewords. The optimal set of error events that corrects each and every codeword may be described by the following expression:

$$E \subset H_1 \cup H_{1,2} \cup H_2 \cup H_{2,3} \cup H_3 \cup \ldots \cup H_{m-1,m} \cup H_m.$$

The events in $H_k$ may be ordered in sequence based on the parity syndromes they produce and may be represented by the following equation:

$$H_k = \{e_1, e_2, e_3, \ldots, e_{2^t-1}\},$$

where $\Phi[k](e_1) = (0 \ldots 001) \in \{0,1\}^t$, $\Phi[k](e_2) = (0 \ldots 010)$, $\Phi[k](e_3) = (0 \ldots 011)$, etc.

The event weights associated with each preferred error event may be represented as follows: {w($e_1$), w($e_2$), . . . , w($e_{2^t-1}$)}.

If, it is determined that an error event is not possible, its corresponding event weight may be set to infinity, such that a path which utilizes this error event has cumulative weight of infinity. As a consequence this path is not selected. For example, if there happens to be no error event $e_5$ in $G^*(v)$ that can produce a syndrome $\Phi[k]=(0 \ldots 0101)$, its corresponding event weight would be set to infinity: $w(e_5)=+\infty$. The Meta-Viterbi Algorithm, as executed by the Meta-Viterbi detector 204, charts various subsets for each of the preferred sets of error events by way of a Meta-Viterbi trellis diagram. As may be visualized using the Meta-Viterbi trellis diagram, every subset of $H_k$ corresponds to a path through the Meta-Viterbi trellis.

FIG. 3A is a table illustrating the computation of cumulative parity and cumulative weight of a subset of error events (subset of $H_k$) associated with a four-bit parity codeword, in accordance with an embodiment of the invention. The subset of error events comprises $\{e_3, e_7, e_{10}, e_{15}\}$. The exemplary path shown in FIG. 3A corresponds to a sequence of error event steps—"no $e_1$", "no $e_2$", "$e_3$", "no $e_4$", "no $e_5$", etc. The Meta-Viterbi path taken corresponds to a series of error event decisions made at each step of the sequence. The second row of the table provides the event parity associated with the error event that is taken. The third row of the table provides the event weight associated with the error event that is taken. The fourth row provides the cumulative parity at each step of the trellis path based on the error events taken. The fifth row provides the cumulative event weight at each step of the 16 state Meta-Viterbi trellis diagram. The Meta-Viterbi trellis comprises $2^t$ states and in this embodiment, t=4. Each event parity corresponds to an associated event weight. By way of using the Meta-Viterbi trellis, the path that provides the smallest cumulative event weight for a codeword is chosen given the codeword's parity syndrome and one or more possible boundary error events. This path corresponds to an optimal set of error events that corrects the output provided by the Viterbi detector, v.

FIG. 3B is a diagram illustrating the 16 state Meta-Viterbi trellis path taken when the error events chosen correspond to $\{e_3, e_7, e_{10}, e_{15}\}$, as described in relation to FIG. 3A, in accordance with an embodiment of the invention. Alternatively, the sequence of event choice steps which forms a path through the trellis may be indicated as follows: "No $e_1$, No $e_2$, $e_3$, No $e_4$, No $e_5$, No $e_6$, $e_7$, No $e_8$, No $e_9$, $e_{10}$, No $e_{11}$, No $e_{12}$, No $e_{13}$, No $e_{14}$, $e_{15}$". The path corresponds to the cumulative parity as displayed by the fourth row of the table illustrated in FIG. 3A. The path shown is only one representative embodiment of a path taken through the 16 state Meta-Viterbi trellis. As illustrated, the path ends with a cumulative parity equal to "0001". The path through the Meta-Viterbi trellis determines the error events which may be used to correct the received codeword generated by the Viterbi detector. In the absence of codeword boundary errors, the path taken comprises a path ending with a cumulative parity corresponding to the syndrome of the codeword.

Figure 4:
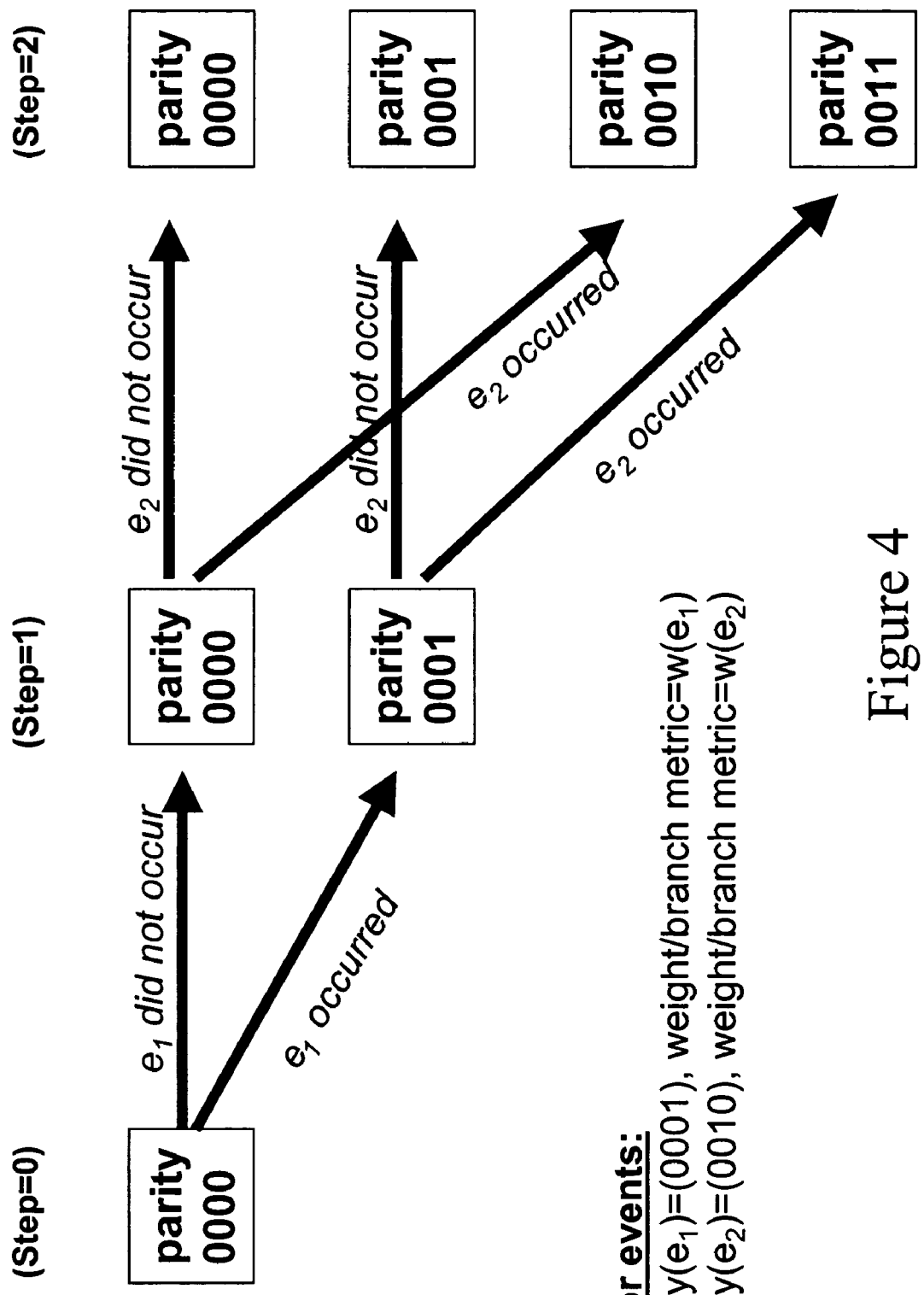
FIG. 4 illustrates a portion of a Meta-Viterbi trellis diagram in accordance with an embodiment of the invention.

FIG. 4 illustrates a diagram of a Meta-Viterbi trellis diagram in accordance with an embodiment of the invention. As shown, step=0 is the starting point for all paths of a four-bit parity codeword. The various states (or cumulative parity) and associated event weights (or path metrics) are listed for the three steps illustrated in FIG. 4. The following three steps list the states, path memory, and path metric associated with each step of an exemplary first codeword of a received sequence of codewords, for a 16 state Meta-Viterbi detector:

Step 0, Word=1:
State (0000): path memory={ }, path metric=0
Other 15 states (0001) through (1111) are invalid Step 1, Word=1:
State (0000): path memory={ }, path metric=0
State (0001): path memory=$\{e_1\}$, path metric=$w(e_1)$
Other 14 states are invalid Step 2, Word=1:
State (0000): path memory={ }, path metric=0
State (0001): path memory=$\{e_1\}$, path metric=$w(e_1)$
State (0010): path memory=$\{e_2\}$, path metric=$w(e_2)$
State (0011): path memory=$\{e_1, e_2\}$, path metric=$w(e_1)+w(e_2)$
Other 12 states are invalid As we progress through the steps, all 16 states become valid and we start performing ACS operations in a similar fashion as may be performed using the Viterbi Algorithm. The ACS operations allow elimination of "non-survivor" paths when determining the path having the least cumulative event weight.

Figure 5:
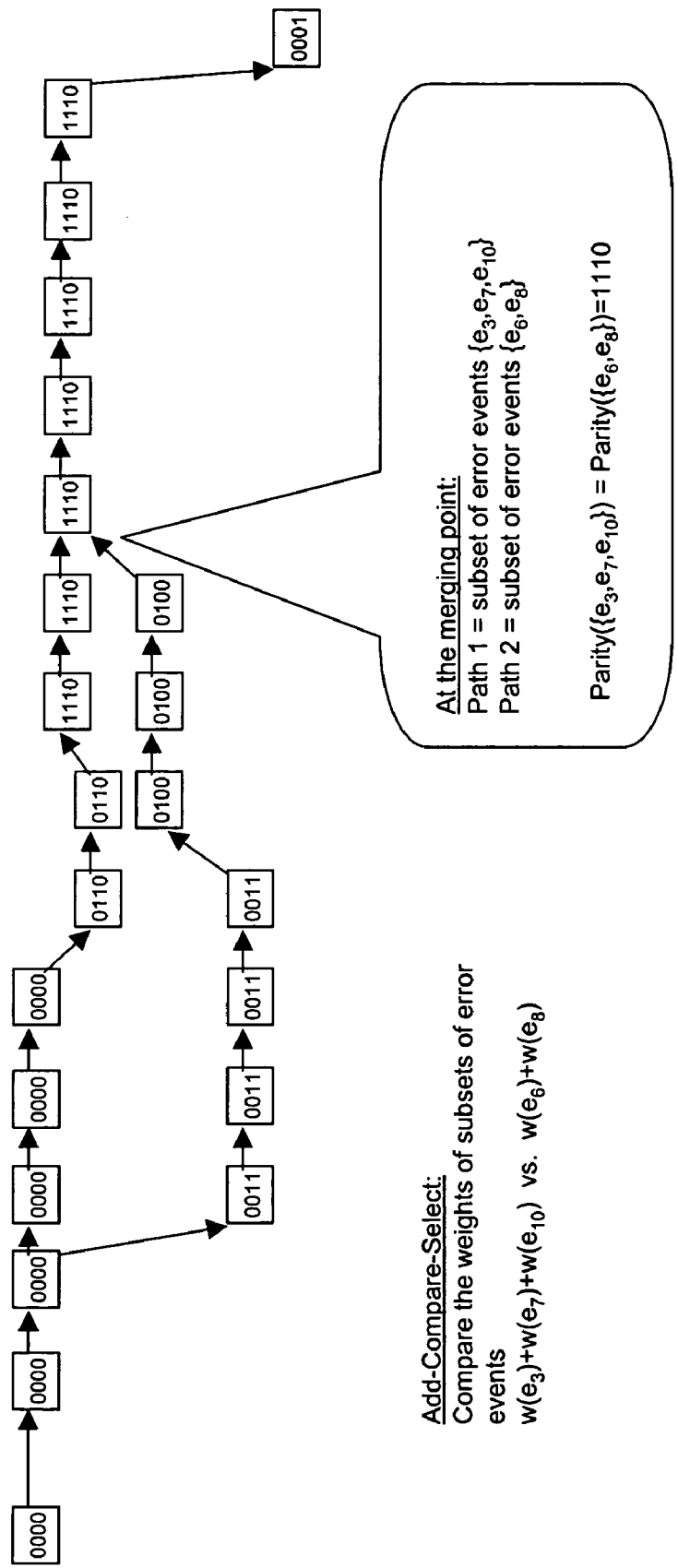
FIG. 5 is a diagram illustrating the selection of a path having lowest cumulative event weight, when two paths merge in a Meta-Viterbi trellis, in accordance with an embodiment of the invention.

FIG. 5 is a diagram illustrating the selection of a path having lowest cumulative event weight, when two paths merge in a Meta-Viterbi trellis, in accordance with an embodiment of the invention. As may be seen, the cumulative parity is the same for the two paths (1110). However, their associated cumulative weights may differ. For the first path, the cumulative weight is equal to $w(e_3)+w(e_7)+w(e_{10})$ while in the second path, the cumulative weight is equal to $w(e_6)+w(e_8)$. At the merge point illustrated, each respective path has undergone a sequence of different error events. In one instance, the path comprises the error events $\{e_3, e_7, e_{10}\}$ while in the other instance, the path comprises the error events $\{e_6, e_8\}$. However, at the end of the path, the two paths meet with the same cumulative parity. The Meta-Viterbi detector performs an add, compare, and select (ACS) operation similar to that performed by the Viterbi Algorithm. This process allows elimination of "non-survivor" paths when determining the path with the lowest path metric or lowest cumulative event weight. The Meta-Viterbi detector may utilize the following pseudo-language sequence of steps which may be used to implement a state machine for performing the Meta-Viterbi Algorithm when constructing a trellis within a codeword:

---

Meta Viterbi algorithm applied within the kth codeword:
State=r(Step=j, Word=k):

---

The predecessor states are:
    State=$r_1$(Step=j−1, Word=k)
    State=$r_2$(Step=j−1, Word=k)
    where $r_1 = r \oplus \Phi[k](e_j)$, $r_2 = r$,
If neither predecessor is valid, the State=r(Step=j, Word=k) is declared not valid
If only one predecessor State=$r_1$(Step=j−1, Word=k) is valid, set
    PathMemory(State=r, Step=j, Word=k) =
$\{e_j\}$ ∪ PathMemory(State=$r_1$, Step=j−1, Word=k) (2)
    PathMetric(State=r, Step=j, Word=k) = $w(e_j)$ +
PathMetric(State=$r_1$, Step=j−1, Word=k) (3)
If only one predecessor State=$r_2$(Step=j−1, Word=k) is valid, set
    PathMemory(State=r, Step=j, Word=k) =
    PathMemory(State=$r_2$, Step=j−1,
Word=k) (4)
    PathMetric(State=r, Step=j, Word=k) =
    PathMetric(State=$r_2$, Step=j−1,
Word=k) (5)
If both predecessors are valid perform, compare:
    $w(e_j)$ + PathMetric(State=$r_1$, Step=j−1, Word=k) vs.
    PathMetric(State=$r_2$,
Step=j−1, Word=k)
    If the left-hand-side is smaller, perform (2) and (3), otherwise perform
(4) and (5).

As indicated in the pseudo-language above, the Meta-Viterbi algorithm determines the sequence of error events by using the PathMemory variable. The Meta-Viterbi algorithm determines the path metric or cumulative event weight by using the PathMetric variable. When the paths merge, the Meta-Viterbi algorithm performs a comparison between the two path metrics associated with the two paths. It determines the path metric which has the smaller value and subsequently stores the associated sequence of error events and path metric.

When applied at the boundaries between two codewords, the Meta-Viterbi algorithm is used to provide a set of boundary error events. The possible i boundary error events may be represented by $H_{k,k+1} = \{b_1, b_2, b_3, \ldots, b_i\}$. There are a total of i+1 branches between all states at Step=$2^t-1$, Word=k and all states at Step=0, Word=k+1. The branches correspond to a total of i+1 choices of the boundary events: "no event", $b_1$, $b_2, \ldots, b_i$. All paths through the Meta-Viterbi trellis must satisfy the requirement that the cumulative parity of the kth codeword must be equal to $\pi_k = \Phi[k](v)$. This imposes the constraint that the branch corresponding to the error event emanates from only one state r so that $r \oplus \Phi[k](b_j) = \pi_k$.

Figure 6:
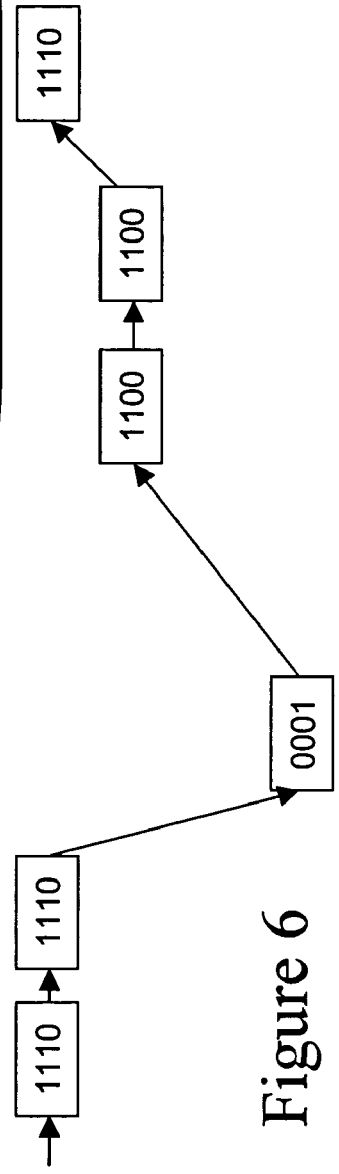
FIG. 6 illustrates using the Meta-Viterbi algorithm applied at a boundary between two codewords, in accordance with an embodiment of the invention.

FIG. 6 illustrates using the Meta-Viterbi algorithm applied at a boundary between two codewords, in accordance with an embodiment of the invention. The Meta-Viterbi detector may utilize the following pseudo-language sequence of steps to implement a state machine for the Meta-Viterbi Algorithm that determines the branches of a Meta-Viterbi trellis for the boundary between the two codewords:

---

Meta-Viterbi algorithm applied at the boundary between kth codeword and (k + 1)st codeword:

Given $H_{k,k+1} = \{b_1, b_2, b_3, \ldots, b_i\}$ with $\pi_k = \Phi[k](v)$ and $\pi_{k+1} = \Phi[k+1](v)$.
Introduce the following i+1 branches connecting (Step=$2^t-1$, Word=k) and (Step=0, Word=k+1)
State=$\pi_k$ (Step=$2^t-1$, Word=k) → State=0 (Step=0, Word=k+1)
    Branch Metric=0, Path Memory for the Branch={ }
State=$\pi_k \oplus \Phi[k](b_1)$ (Step=$2^t-1$, Word=k) → State=$\Phi[k+1](b_1)$ (Step=0, Word=k+1)
    Branch Metric=$w(b_1)$, Path Memory for the Branch={$b_1$}
...
State=$\pi_k \oplus \Phi[k](b_i)$ (Step=$2^t-1$, Word=k) → State=$\Phi[k+1](b_i)$ (Step=0, Word=k+1)
    Branch Metric=$w(b_i)$, Path Memory for the Branch={$b_i$}

---

As indicated above in the pseudo-language code applied for the boundary between two codewords, an associated error event and event weight is stored using variables.

Once the one or more branches are computed in the Meta-Viterbi trellis, one can perform ACS operations just as it may be done within a codeword. In a representative embodiment, for a typical implementation using t=4 or t=6 bits parity, the total number of ACS operations that need to be performed at the boundary between codewords is smaller than the total number of ACS operations that are performed at a particular step within the codeword.

As illustrated in FIG. 6, there are two possibilities for the codeword boundary between the first and second codeword: "no boundary event" and "$b_1$ event". The parity syndrome for the first codeword is $\pi_1 = \Phi[1](v) = [0001]$, since it must match the cumulative parity of the first codeword. (i.e., the cumulative parity of the first codeword must match the parity of the PRML Viterbi output) Therefore the branch that corresponds to the "no boundary event" can only emanate from state "0001" to assure that any path through meta-trellis fixes the parity errors in the sequence n. When the boundary error event is considered, the branch associated with this "$b_1$ event" is determined as follows. The corresponding parity syndromes of the $b_1$ error event for the first and second codewords are as follows: $\Phi[1](b_1) = [0101]$ and $\Phi[2](b_1) = [1100]$. Therefore the corresponding branch should start from state [0100] because it assures that the parity of the first codeword is equal to $\pi_1$. The branch should end at state [1100] since this state corresponds to the "initial state" of the 2nd codeword, prior to adding error events. As a result, the path through the Meta-Viterbi trellis is as shown in FIG. 6.

Figure 7:
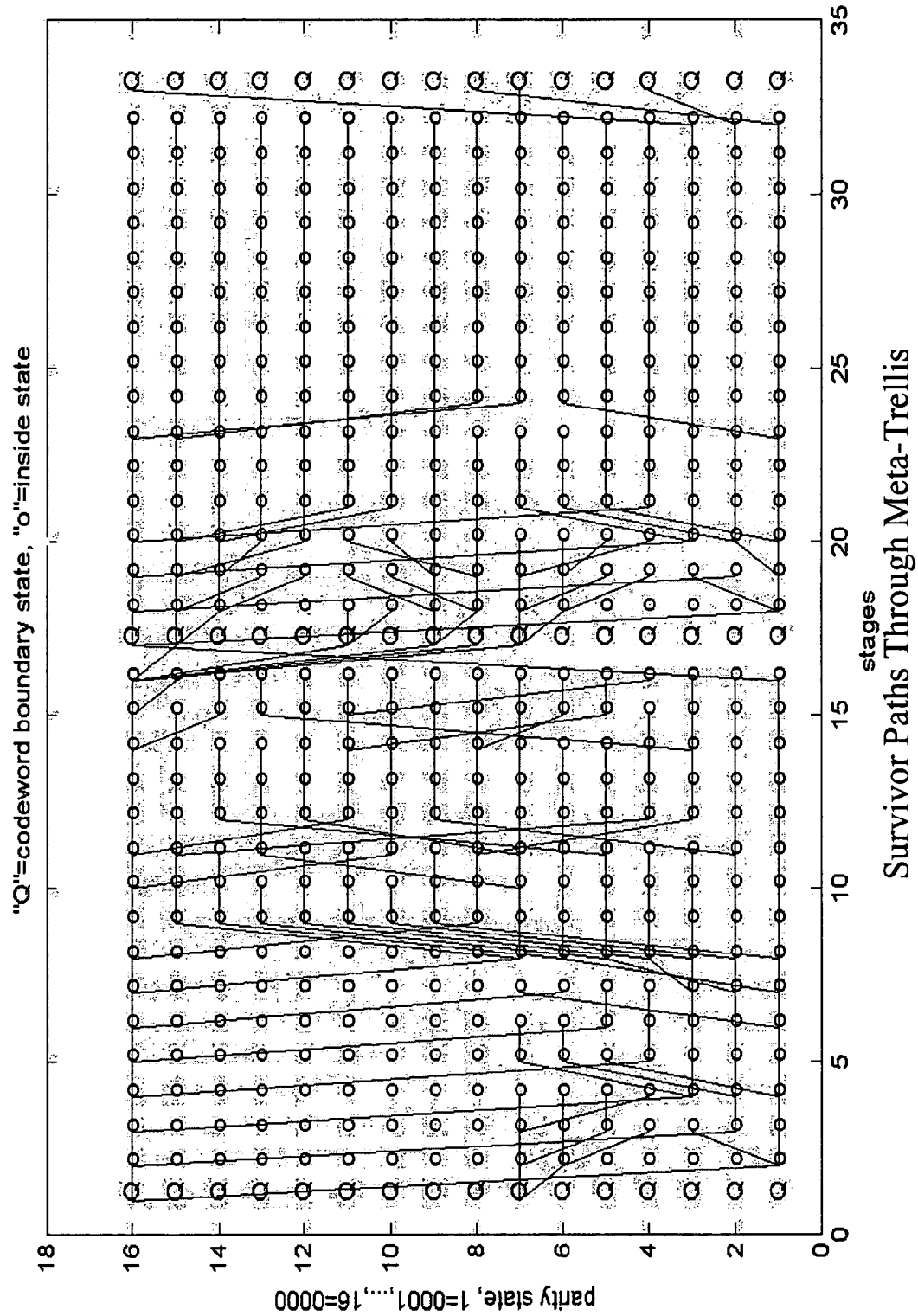
FIG. 7 is a diagram of the survivor paths in a Meta-Viterbi trellis for the case of a 4-bit parity code, in accordance with an embodiment of the invention.

FIG. 7 is a diagram of the survivor paths in a Meta-Viterbi trellis for the case of a 4-bit parity code, in accordance with an embodiment of the invention. The survivor paths represent paths that are retained after discarding one or more non-minimal path metric paths in the trellis diagram. In the instance where the $2^s$ state Viterbi detector does not make any errors during the detection process, the Meta-Viterbi algorithm will generate the all-zero path, in which no error events are selected. In a representative embodiment, the average power dissipation of the detection process is reduced by turning off power to the Meta-Viterbi detector for codewords that exhibit a zero parity syndrome.

Figure 8:
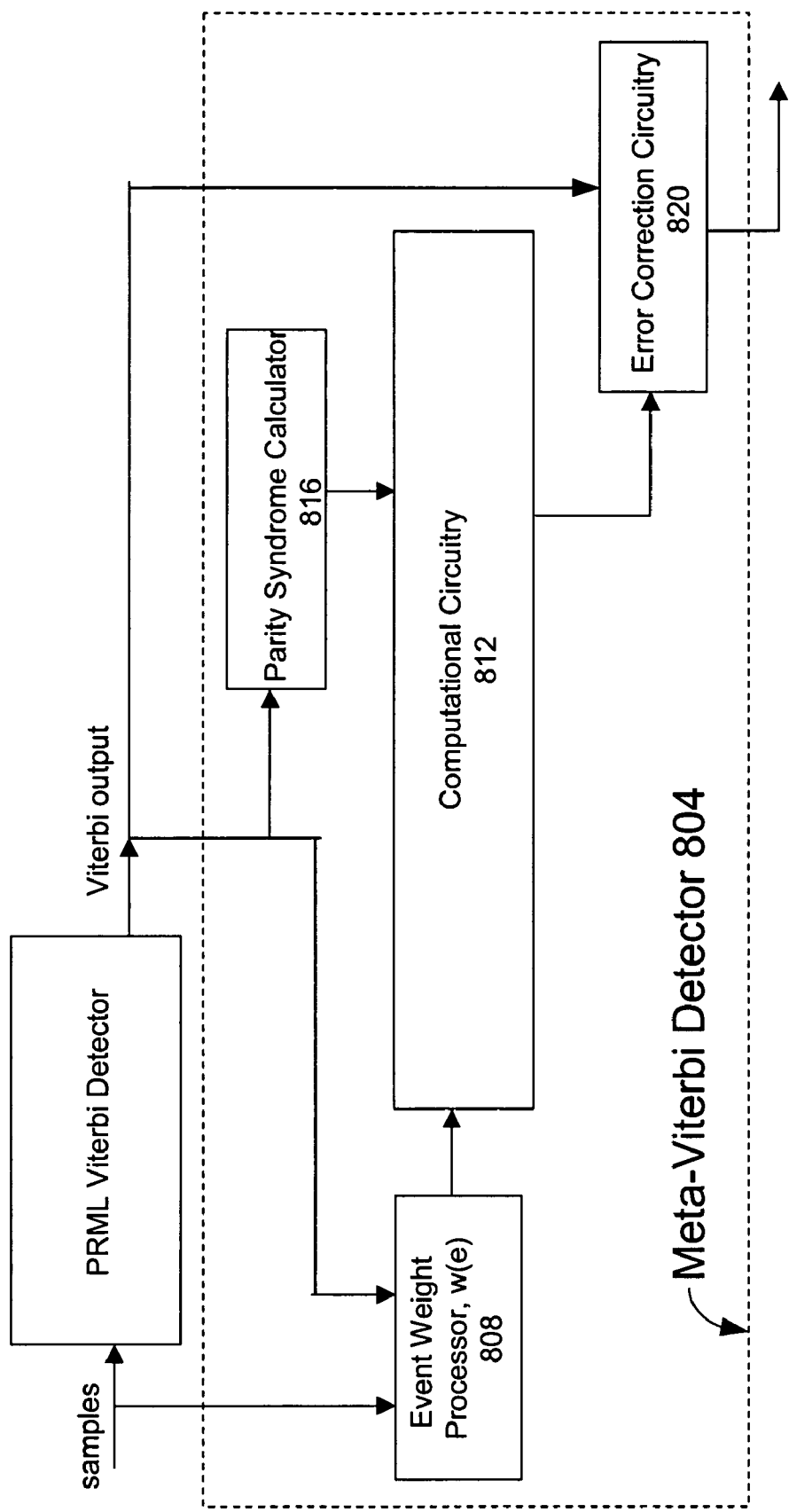
FIG. 8 is a functional block diagram of a Meta-Viterbi detector in accordance with an embodiment of the invention.

FIG. 8 is a functional block diagram of a Meta-Viterbi detector 804 in accordance with an embodiment of the invention. The Meta-Viterbi detector 804 comprises an event weight processor 808, a computational circuitry 812, a parity syndrome calculator 816, and an error correction circuitry 820. The event weight processor 808 is capable of generating one or more event weights, w(e), of a trellis. The computational circuitry 812 is capable of computing one or more parameters associated with a Meta-Viterbi trellis. The event weight processor 808 processes a sequence of noisy received codewords, $\xi$, and output codewords provided by a PRML Viterbi detector. The computational circuitry 812 determines the error events which have the smallest event weights for each parity syndrome for a particular received codeword. Further, the computational circuitry 812 records any and all error events that may be applied across boundaries between codewords. The parity syndrome calculator 816 computes the parity syndrome values associated with one or more codewords. The parity syndrome calculator 816 processes the output provided by the PRML Viterbi detector and outputs the parity syndrome values to the computational circuitry 812. As illustrated, the computational circuitry 812 receives event weights computed by the event weight processor 808 and the values calculated by the parity syndrome calculator 816. The computational circuitry 812 determines the optimal path corresponding to a minimum cumulative event weight of the one or more paths of a trellis diagram. The computational circuitry 812 may compute the cumulative parity of the sequence of error events. The computational circuitry 812 may perform one or more ACS operations when determining one or more cumulative event weights of one or more paths in the trellis diagram. The computational circuitry 812 may compute one or more event weights associated with one or more error events of a codeword. Additionally, the computational circuitry 812 may compute cumulative event weights associated with the one or more codewords. The error correction circuitry 820 corrects the codewords output by the PRML Viterbi detector. The event weight processor 808, computational circuitry 812, parity syndrome calculator 816, and error correction circuitry 820 may comprise any type of digital logic circuitry used to implement an appropriate state-machine.

In a representative embodiment, implementation of a 64-state Meta-Viterbi detector, utilizes a gate-count that is approximately two-thirds of the gate count of a conventional 16-state Viterbi. The state-machine used for keeping track of branches in Meta-Viterbi trellis is rather simple. The trellis is fixed for inside of the codeword and it varies only at the boundaries between codewords where the branches depend on which error events belong to $H_{k,k+1}$. The complexity of the error event metric or event weight calculation depends on what type of detection is used. For data-independent noise prediction (also known as classical linear Viterbi), an appropriate implementation utilizes matched filters and constant additions. For data-dependent noise prediction, this implementation becomes more complex.

It is estimated that for performing data-dependant noise prediction using a 6-bit parity code, the codeword detection process (including the Meta-Viterbi detection process) is approximately 120% more complex than that of a 16-state Viterbi detector. In the case of data-independent noise prediction, the codeword detection process (including the Meta-Viterbi detection process) is similar to that of the 16-state Viterbi detection process.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed, but that the invention will include all embodiments falling within the scope of the appended claims.

What is claimed is:

1. A method comprising:
   receiving one or more noisy codewords, said one or more noisy codewords comprising one or more codewords added to additive white Gaussian noise, said one or more codewords generated from a linear block encoder;
   first processing said one or more noisy codewords using a first circuitry;
   generating an output from said first circuitry based on said one or more noisy codewords;
   second processing said output and said one or more noisy codewords using a second circuitry, said second circuitry used to generate one or more error event weights;
   computing the minimum cumulative weight of said one or more error event weights of a codeword of said output; and
   using a set of error events associated with said minimum cumulative weight of said one or more error event weights of said codeword to correct data bit errors of said codeword.

2. The method of claim 1 wherein said second circuitry computes said set of error events, $E=\{e_1, e_2, \ldots, e_n\}$, $E \subset G^*(v)$, said output, v, of said first circuitry defined by the equation, $$v = \underset{x \in \{0,1\}^X}{\operatorname{argmax}} \log P(\xi|x),$$

wherein $\xi$ represents said one or more noisy codewords.

3. The method of claim 2 wherein a linear operator, $\Phi[k]: \{0,1\}^X \to \{0,1\}^t$, computes the parity syndrome value of each said one or more noisy codewords such that $\Phi[k](E):=\Phi[k](e_1) \oplus \Phi[k](e_2) \oplus \ldots \oplus \Phi[k](e_n)=\pi_k$, $\forall k$, wherein the sum of the event weights represented by said set of error events has a minimum value.

4. The method of claim 3 wherein one or more preferred error events are determined for each of said one or more noisy codewords such that the following conditions apply:

$$\Phi[k](e) = \pi \neq 0, \Phi[j](e) = 0 \forall j \neq k$$

and $$e = \underset{x \in \Omega}{\operatorname{argmin}} w(x),$$

where $$\Omega = \{x \in G*(v), \Phi[k](x) = \pi, \Phi[j](x) = 0 \forall j \neq k\}.$$

5. The method of claim 4 wherein said second processing comprises:
   constructing a trellis diagram for each of said one or more noisy codewords using branches determined from one or more sets of event choice steps;
   determining a path of said trellis diagram associated with a minimum cumulative event weight; and
   correcting said each of said one or more noisy codewords.

6. The method of claim 5 wherein said minimum cumulative event weight satisfies the equation:

$$\pi_k = \Phi[k](v).$$

7. The method of claim 6 further comprising a boundary constraint between codewords defined by the following equation:

$$r \oplus \Phi[k](b_j) = \pi_k.$$

8. The method of claim 1 wherein each of said one or more codewords comprises t parity bits.

9. The method of claim 1 wherein said one or more codewords are transmitted through a read/write channel of a magnetic hard disk drive.

10. The method of claim 1 wherein said one or more codewords comprises 390/396 six-bit parity codes.

11. The method of claim 1 wherein said first circuitry comprises a Viterbi detector.

* * * * *